(12) United States Patent
Yamashita

(10) Patent No.: US 7,129,058 B2
(45) Date of Patent: Oct. 31, 2006

(54) METHOD OF PRODUCTION OF A NANOPARTICLE OF A COMPOUND SEMICONDUCTOR IN A CAVITY OF PROTEIN

(75) Inventor: Ichiro Yamashita, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 355 days.

(21) Appl. No.: 10/727,648

(22) Filed: Dec. 5, 2003

(65) Prior Publication Data

US 2004/0110347 A1 Jun. 10, 2004

Related U.S. Application Data

(63) Continuation of application No. PCT/JP03/06637, filed on May 28, 2003.

(30) Foreign Application Priority Data

May 28, 2002 (JP) ............................. 2002-154778

(51) Int. Cl.
*C12P 1/00* (2006.01)
(52) U.S. Cl. .......................................... 435/41; 438/86
(58) Field of Classification Search ................ 438/286; 435/41

See application file for complete search history.

(56) References Cited

U.S. PATENT DOCUMENTS 5,304,382 A * 4/1994 Monzyk ...................... 424/489
6,121,075 A 9/2000 Yamashita
2002/0155507 A1* 10/2002 Bruchez et al. .............. 435/7.2
2003/0129608 A1* 7/2003 Mirkin et al. .................. 435/6

FOREIGN PATENT DOCUMENTS

EP 0 881 691 A2 12/1998
WO WO 91/02704 3/1991

OTHER PUBLICATIONS

J. Y. Wang, et al., "Formation of Nanoscale Size Cadmium Sulfide Within a Channel Protein Monolayer", Thin Solid Films, vol. 242, No. 1-2, (1994) pp. 127-131.

Kim K. W. Wong, et al., "Biomimetic Synthesis of Cadmium Sulfide-Ferritin Nanocomposites", Advanced Materials, vol. 8, No. 11, pp. 928-932, Nov. 1996.

* cited by examiner

*Primary Examiner*—Hoai Pham
*Assistant Examiner*—Abul Kalam
(74) *Attorney, Agent, or Firm*—McDermott Will & Emery LLP

(57) ABSTRACT

The method of the production of a nanoparticle of the present invention includes a step of forming a nanoparticle of a group II–group VI compound semiconductor in the cavity part of a protein, in a solution containing the protein having a cavity part therein represented by apoferritin, the group II element ion represented by Cd and Zn, and the group VI element ion represented by S and Se. Preferably, the solution further includes an ammonium ion, and the supply of the group VI element ion ($X^{2-}$) into the solution is conducted by adding $H_2NCXNH_2$ to the solution. According to the aforementioned method, semiconductor nanoparticles having a uniform particle size can be produced.

7 Claims, 10 Drawing Sheets

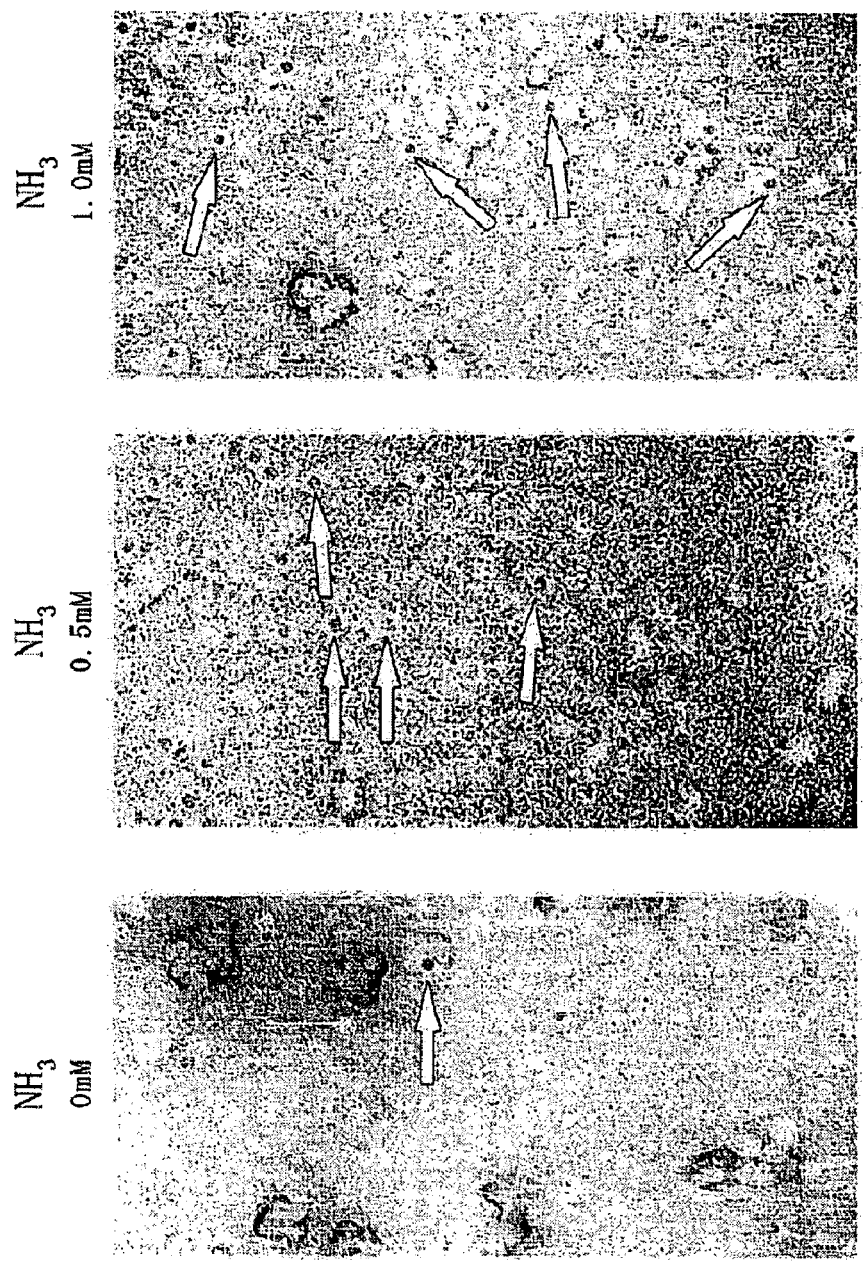

US 7,129,058 B2

METHOD OF PRODUCTION OF A NANOPARTICLE OF A COMPOUND SEMICONDUCTOR IN A CAVITY OF PROTEIN

This is a continuation application under 35 U.S.C. 111(a) of pending prior International Application No. PCT/JP03/06637, filed on May 28, 2003.

BACKGROUND OF THE INVENTION

1. Field of the Invention

The present invention relates to a method of the production of a nanoparticle of a compound semiconductor, a nanoparticle produced by the method of the production, and a complex including a protein and the nanoparticle generated in the production step of the method of the production.

2. Description of the Related Art

Mainstream of the development of functional materials implemented so far involves exploration and synthesis of novel compounds which allow performing a desired function. However, in recent years, it has been desired to allow performing new functions which can not be achieved in a bulk state through producing nanoparticles obtained by fine division of a substance into a nanometer size. In particular, production of nanoparticles of semiconductors or inorganic materials including a metal compound as a center has been strongly desired.

Semiconductor nanoparticles get to a state in which energy levels separate with each other by quantization of the energy levels, and they come to be controlled as a function of the particle size of the nanoparticles. Thus, in semiconductor nanoparticles, position of the peak of an exciton absorption band which appears at a slightly lower energy than the absorption edge in a longer wavelength of basic absorption of the semiconductor crystal can be controlled by changing the particle size of the semiconductor nanoparticles leading to capabilities of absorption and generation of electromagnetic wave which is different from that for the bulk. Accordingly, they are expected for use as luminescent materials and memory materials.

For example, CdSe and ZnSe that are group II–group VI compound semiconductors are known to generate fluorescence, however, the fluorescent wavelength thereof differs depending on the size of the particle (particle size). For engineering utilization of quantum effects of such semiconductor nanoparticles, it is required that nanoparticles having a uniform particle size are produced.

Methods of producing nanoparticles which have been conventionally carried out include physical grinding methods, chemical synthesis methods and the like. For example, the physical grinding methods are widely used in order to obtain starting materials upon baking of ceramics. In addition, examples of the chemical synthesis method include methods in which gold nanoparticles are produced through reducing chloroauric acid among long chain organic compounds. The long chain organic compound herein inhibits the growing of a gold particle to an enormous size.

Further, there exist methods in which a complex between an organic compound and a nanoparticle is generated followed by a chemical reaction to result in uniform particles. As an application of this method, there also exists a method in which gold nanoparticles are obtained having a SAM membrane formed on their surfaces through fixing a gold atom on a material for forming a SAM membrane, and assembling the material such that the gold atom becomes the center. Moreover, a method is also executed in which a micelle including a material which forms a nanoparticle is produced, and nanoparticles are produced using a chemical reaction in the micelle.

However, in the conventional methods as described above, it is difficult to obtain nanoparticles having a uniform particle size. In the physical grinding method, for example, it is originally difficult to make the particle size smaller than the micron size, and even though the size could approximate the nanometer order, no mechanism is established to accomplish a constant particle size. Hence, the great spread of the particle size of thus resulting nanoparticles is inevitably caused. In addition, in the chemical synthesis method, the great spread of the particle size of the resulting nanoparticles is also caused inevitably because a chemical reaction is utilized therein. Further, it is also disadvantageous in respect of the required time period and cost.

On the other hand, in an attempt to apply biotechnology to other field, there exist investigations in which nanoparticles having uniform size in the order of nano are intended to be produced through rendering the incorporation of a metal or a metal compound into apoferritin that is a protein having a function to hold a metal compound. Investigations have been carried out to so that any of various kinds of metals or metal compounds are introduced into apoferritin in compliance with the use of the nanoparticle.

Apoferritin is a protein which is present widespread in animate nature, and plays a role to regulate the amount of iron which is an essential trace element in a living body. A complex of iron or an iron compound with apoferritin is referred to as ferritin. Since iron is deleterious to a living body when it is present in an excessive amount in the body, excess iron is stored in the body in the form of ferritin. Furthermore, ferritin returns to apoferritin through releasing an iron ion as needed.

FIG. 1 is a schematic view illustrating the structure of apoferritin. As shown in FIG. 1, apoferritin 1 is a spherical protein having the molecular weight of about 460,000 with 24 monomer subunits, which are formed from a single polypeptide chain, being assembled via noncovalent bonds, having the diameter of about 12 nm, and exhibits higher thermostability and pH stability in comparison with general proteins. There is a cavity-like holding part 4 having the diameter of about 6 nm in the center of apoferritin 1, and the outside and the holding part 4 are connected via a channel 3. For example, when a bivalent iron ion is incorporated into apoferritin 1, the iron ion enters from the channel 3, and reaches to the holding part 4 after being oxidized in a place which is present within a part of the subunits and is referred to as a ferrooxidase center (iron oxidation active center). The iron ion is thereafter concentrated in a negative charge region on the inner surface of the holding part 4. Then, the iron atoms assemble by 3000 to 4000, and held in the holding part 4 in the form of a ferrihalide ($5Fe_2O_3 \cdot 9H_2O$) crystal. Particle size of the nanoparticle, which was held in the holding part 4, comprising the metal atom is nearly equal to the diameter of the holding part 4, which is about 6 nm.

Using this apoferritin, nanoparticle-apoferritin complexes have been also generated in which a metal or a metal compound other than iron is permitted to be artificially held.

Introduction of a metal or a metal compound such as manganese (P. Mackle, 1993, J. Amer. Chem. Soc. 115, 8471–8472; F. C. Meldrum et al., 1995, J. Inorg. Biochem. 58, 59–68), uranium (J. F. Hainfeld, 1992, Proc. Natl. Acad. Sci. USA 89, 11064–11068), beryllium (D. J. Price, 1983, J. Biol. Chem. 258, 10873–10880), aluminum (J. Fleming, 1987, Proc. Natl. Acad. Sci. USA, 84, 7866–7870), zinc (D. Price and J. G. Joshi, Proc. Natl. Acad. Sci. USA, 1982, 79, 3116–3119) or cobalt (T. Douglas and V. T. Stark, Inorg. Chem., 39, 2000, 1828–1830) into apoferritin has been reported so far. The particle size of the nanoparticles including these metals or metal compounds is also nearly equal to the diameter of the holding part 4 of apoferritin, which is about 6 nm.

In natural world, summary of the process in which nanoparticles including an iron atom are formed in apoferritin are as follows.

On the surface of the channel 3 which connects between the outside and inside of apoferritin 1 (see, FIG. 1) are exposed amino acids having a negative charge under a condition of pH of 7–8, thus $Fe^{2+}$ ions having a positive charge are incorporated into the channel 3 by an electrostatic interaction.

On the inner surface of the holding part 4 of apoferritin 1 are exposed a lot of glutamic acid residues which are amino acid residues having a negative charge at pH 7–8, similarly to the inner surface of the channel 3, and the $Fe^{2+}$ ions incorporated from the channel 3 are oxidized at the ferroxidase center, followed by introduction to the internal holding part 4. Then, the iron ions are concentrated by an electrostatic interaction, and the core formation of a ferrihalide ($5Fe_2O_3 \cdot 9H_2O$) crystal is caused.

Thereafter, a core is grown which includes iron oxide through adherence of the iron ions which are sequentially incorporated to the crystal core, and accordingly, a nanoparticle having the particle size of 6 nm is formed in the holding part 4. Summary of the formation of a nanoparticle including iron oxide as well as the incorporation of the iron ions is as set forth above.

Although a mechanism of the incorporation of iron ions into apoferritin and a method of the preparation of apoferritin including iron oxide therein were described hereinabove, it is believed that other metal ions which were reported hitherto as candidates for the introduction also involve an approximately similar mechanism to that for the iron ion.

However, those which can be incorporated in the cavity part by the method described above were limited to particular metals or metal compounds.

SUMMARY OF THE INVENTION

An object of the present invention is to solve the aforementioned conventional problem, and to provide a method of the production a nanoparticle which enables obtaining semiconductor nanoparticles having a uniform particle size.

The method of the production of a nanoparticle according to the present invention comprises a step of forming a nanoparticle of a compound semiconductor in a cavity part of a protein, in a solution containing the protein having the cavity part therein and an ion of an element to be a material of the compound semiconductor.

In one embodiment, the method comprises a step of forming a nanoparticle of a group II–group VI compound semiconductor in the cavity part of the protein, in a solution containing the protein, a group II element ion, and a group VI element ion. The group II element herein refers to an element belonging to group 12 in the periodic table, and for example, means Zn and Cd. The group VI element refers to an element belonging to group 16 in the periodic table, and for example, means O, S, and Ce.

Preferably, the aforementioned solution contains a complex ion having the aforementioned group II element ion as a central metal. Preferably, a complex ion having the aforementioned group II element ion as a central metal is included in the cavity part of the aforementioned protein.

For example, the aforementioned solution further contains an ammonium ion. In addition, for example, a complex ion having the aforementioned group II element ion as a central metal and having ammonia as a ligand is present in the aforementioned solution. For example, a complex ion having the aforementioned group II element ion as a central metal and having ammonia as a ligand is present in the cavity part of the aforementioned protein.

Preferably, supply of the aforementioned group VI element ion ($X^{2-}$) into the aforementioned solution is conducted by adding $H_2NCXNH_2$ to the aforementioned solution. For example the X is Se or S.

For example, the aforementioned group II element is zinc (Zn) or cadmium (Cd), whilst the aforementioned group VI element is sulfur (S) or selenium (Se).

For example, the aforementioned nanoparticle is formed from at least one compound semiconductor selected from the group consisting of CdSe, ZnSe, CdS and ZnS.

For example, the aforementioned protein is at least one of apoferritin, Dps protein, CCMV protein or TMV protein.

Furthermore, after forming the aforementioned nanoparticle, the method may further comprise a step of eliminating the protein by a heat treatment.

In addition, the present invention concerns a nanoparticle produced by the aforementioned method of the production.

Moreover, the present invention concerns a complex comprising a nanoparticle and a protein, which complex is generated in the production step of the aforementioned method of the production of a nanoparticle. The aforementioned protein may be any one of those having a part which specifically binds to a particular protein.

These objects as well as other objects, features and advantages of the invention will become apparent to those skilled in the art from the following description with reference to the accompanying drawings.

BRIEF DESCRIPTION OF THE DRAWINGS

FIGS. 5A, 5B and 5C show electron micrographs illustrating states of the formation of the nanoparticles.

DESCRIPTION OF THE PREFERRED EMBODIMENTS

The embodiments of the present invention are explained below with reference to accompanying drawings.

(Embodiment 1)

In this embodiment, $Cd^{2+}$ and $Se^{2-}$ are subjected to a reaction in the cavity having a diameter of several nanometers of a protein in order to produce semiconductor nanoparticles composed of CdSe having a uniform particle size. The protein that may be used can be any one which meets the requirements described below.

First, the protein has a cavity therein having a fixed size.

Second, the surface of the cavity has a positive or negative charge, and has an electric potential difference from the outside.

Third, there exists a channel which connects between the cavity and the outside.

Fourth, the channel has a size which allows passage of an ion, and does not have any obstacle which interferes the passage of the ion.

Fifth, the protein is sufficiently stable under a condition of the chemical reaction for producing a nanoparticle.

Any protein constituted from a single subunit or any protein constituted from multiple subunits may be used as long as it meets the requirements 1 to 5 as described above. Further, the protein is not limited to one with a cavity part having a spherical form, but may be any one with a cavity part having a rod shape, a ring shape or the like. There are a lot of proteins which meet the requirements 1 to 5 described above, and typical examples of the protein include apoferritin, Dps protein, viral protein and the like. Examples of the viral protein include for example, CPMV, CCMV, HSV, Rotavirus, Reovirus, LA-1, Polyoma, CaMV, HPV, Ross River, SpV-4, φX174, FHV, HRV-14, Polio and the like. Preferably, a viral protein such as LFA-1CPMV or CCMV may be used. According to the method of this embodiment, nanoparticles are rendered to be formed in compliance with the form and size of the cavity part of the protein used. Nanoparticle herein refers to a particle having a major axis of 50 nm or less, and having the size at least allowing for stable presence as a particle. Exemplary nanoparticles correspond to particles having a major axis of 1 nm to 50 nm.

A protein is produced on the basis of information of a DNA, and is readily reproduced in a large number by any known method. Further, it is well known that proteins reproduced from the identical DNA in a large number have the same structure in an accuracy of the angstrom level. Therefore, it is easy to prepare a protein which meets the requirement 1 described above.

In this embodiment, apoferritin is utilized which is a protein having a function to hold a metal or a metal compound.

Figure 2:
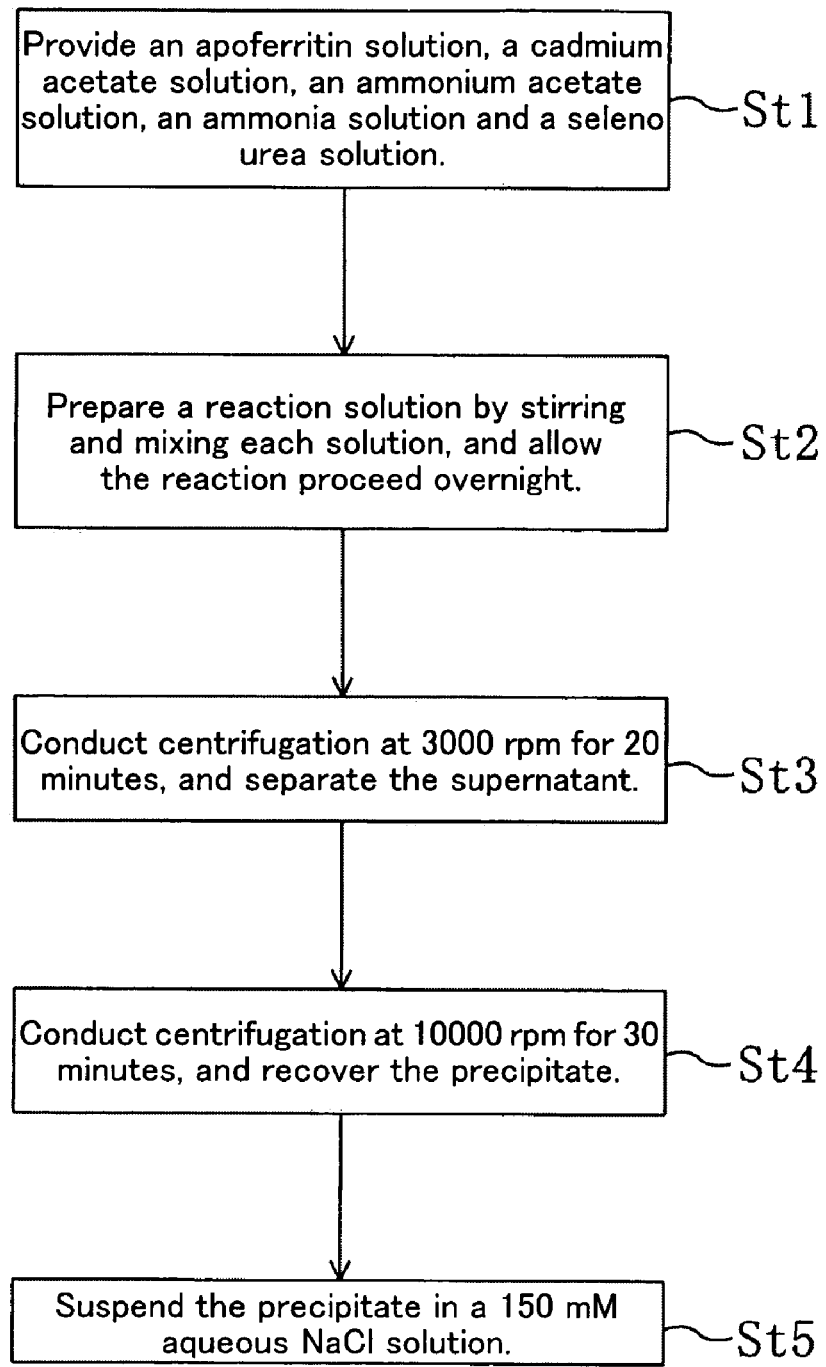
FIG. 2 is a flow chart illustrating a method of the production of semiconductor nanoparticles.

Next, a method for producing a complex having a protein including a semiconductor nanoparticle therein which is composed of CdSe by using apoferritin (hereinafter, may be also referred to as a CdSe-apoferritin complex), is specifically explained with reference to FIG. 2. FIG. 2 is a flow chart illustrating a method of the production of a semiconductor nanoparticle of this embodiment. All steps in the method of this embodiment demonstrated below are carried out at room temperature in a scale of 200 ml. Moreover, unless described in particular, the term "solution" used herein means a solution with water used as a solvent.

First, as shown in FIG. 2, in the step St1, a 50 mg/ml apoferritin solution, a 100 mM cadmium acetate solution, a 1 M ammonium acetate solution, and a 100 mM aqueous ammonia are provided. In addition, a 100 mM seleno urea solution is provided by dissolving seleno urea ($H_2NCSeNH_2$) in a small amount of ethanol (approximately 10 μl), and thereto adding purified water to give the concentration of 100 mM. Moreover, since seleno urea is unstable upon dissolution in water, the seleno urea solution is prepared immediately before the step set forth below.

Figure 3:
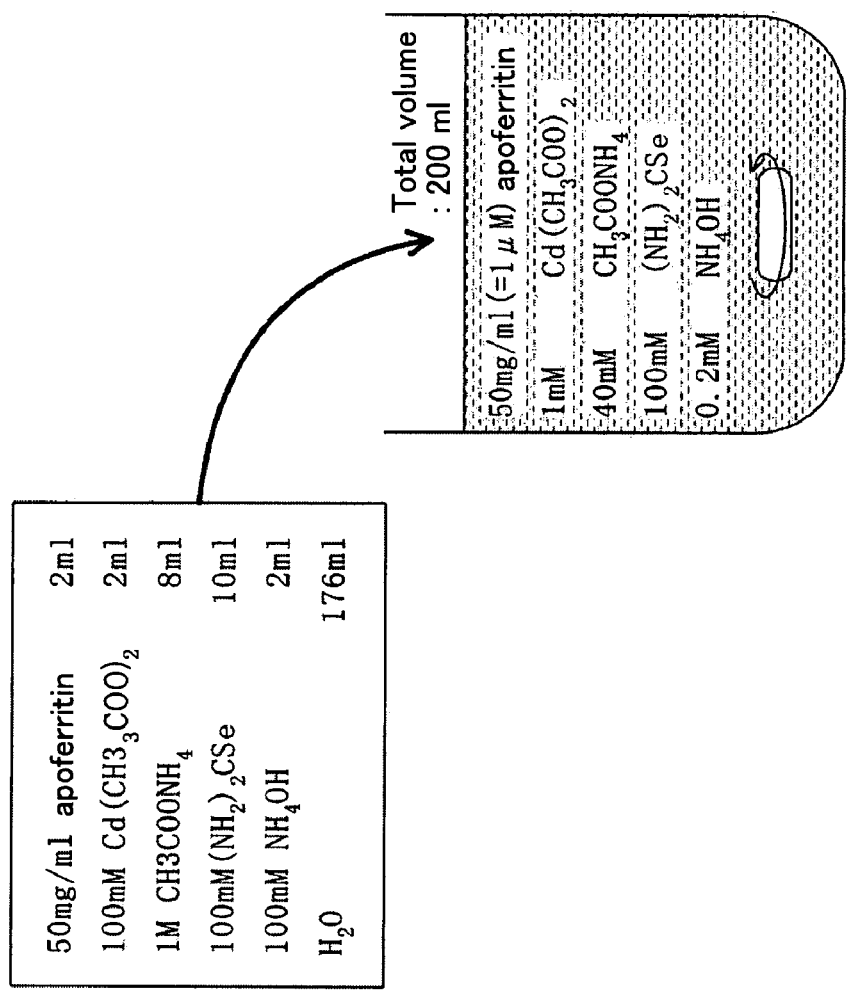
FIG. 3 is a schematic view illustrating the step St1 and the step St2 shown in FIG. 2.

Next, in the step St2, a reaction solution is prepared by admixing each solution provided in the aforementioned step St1, and adding purified water thereto until total volume becomes 200 ml. Each concentration of apoferritin, cadmium acetate, ammonium acetate, seleno urea and ammonia in the reaction solution described above is as listed in FIG. 3. FIG. 3 is a schematic view illustrating the step St1 and the step St2.

Subsequently, as shown in FIG. 3, the reaction is allowed to proceed while stirring the reaction solution. In the aforementioned reaction solution, the reaction is spontaneously initiated immediately after the preparation. In this embodiment, additional stirring of the reaction solution is carried out over day and night. Although the reaction caused herein is not rapid, but is completed within a few minutes to a few hours. By this operation, CdSe is introduced into the holding part of apoferritin to generate a CdSe-apoferritin complex (hereinafter may be also referred to as merely "complex").

Next, in the step St3, the reaction solution is placed into a vessel, and centrifuged under a condition of 3000 revolutions per minute for 20 minutes using a centrifugal separator to remove precipitates. In this case, complexes are present in the supernatant in a dispersed form.

Next, in the step St4, the supernatant obtained after removing the precipitates is further centrifuged under a condition of 10000 revolutions per minute for 30 minutes to precipitate the complex.

Next, in the step St5, the precipitates obtained in the aforementioned step St4 are suspended in a 150 mM NaCl solution to produce a complex solution. Upon this operation, adjustment of pH may not be particularly conducted.

Accordingly, apoferritin having a semiconductor nanoparticle included therein which is composed of CdSe, i.e., a CdSe-apoferritin complex is obtained.

Figure 1:
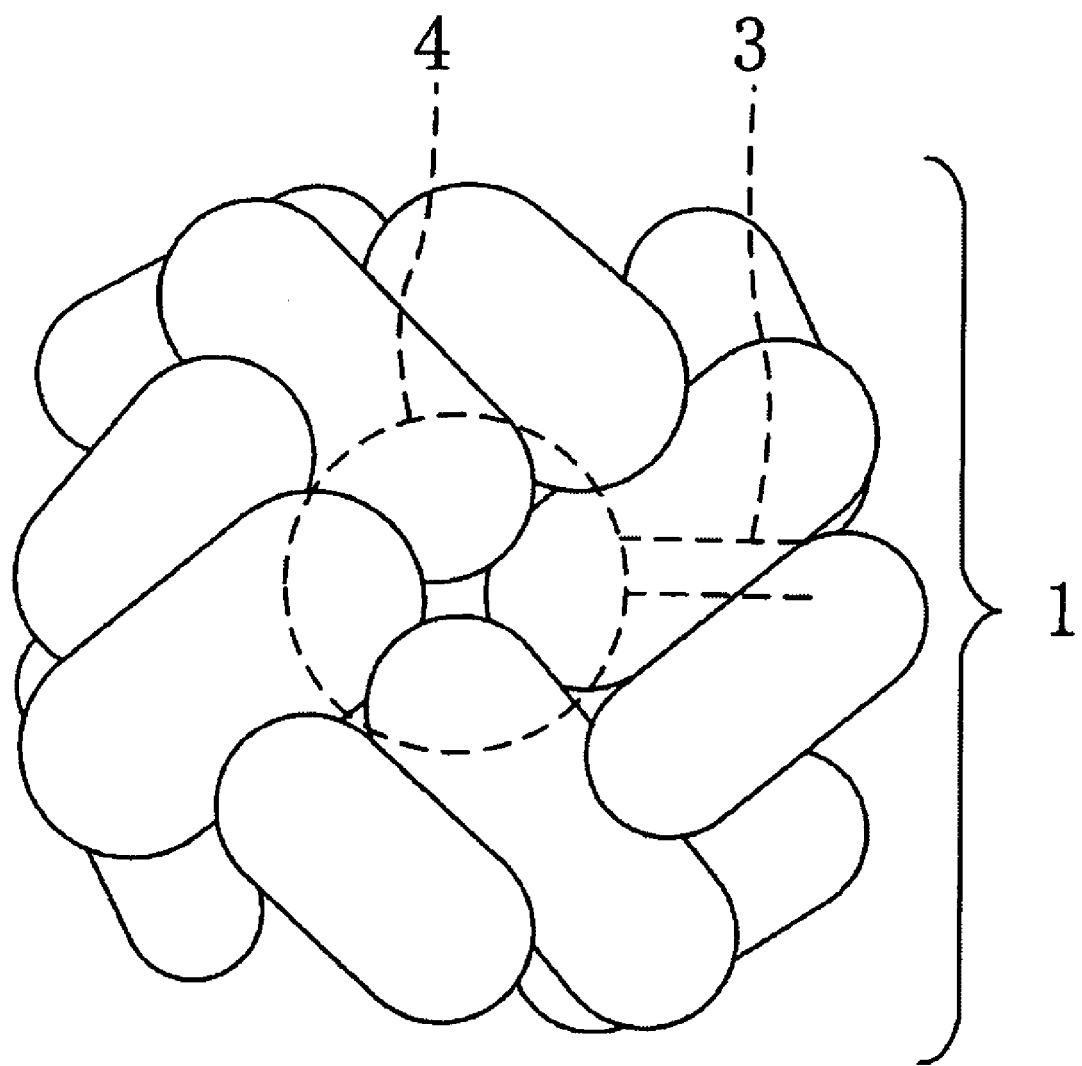
FIG. 1 is a schematic view illustrating the structure of apoferritin.
Figure 4:
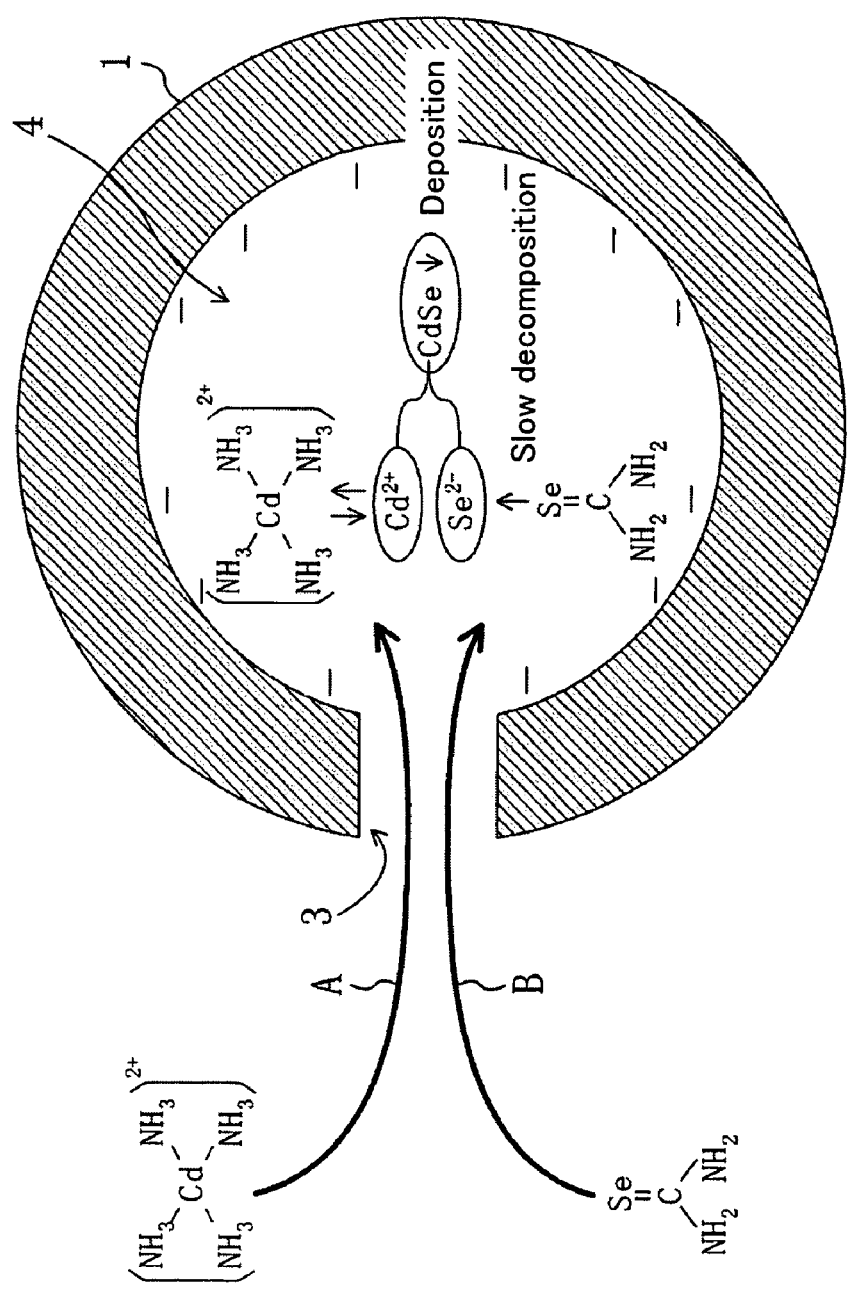
FIG. 4 is a schematic view illustrating a reaction which is supposed to take place in the step St2 shown in FIG. 2.

The mechanism involving in the formation of a CdSe-apoferritin complex in the aforementioned step St2 is speculated, and explained with reference to FIG. 4. FIG. 4 is a schematic view for explaining a mechanism involving in the formation of a CdSe-apoferritin complex. In FIG. 4, apoferritin shown in FIG. 1 is depicted in a more simplified manner for facilitating the understandings. Therefore, common symbols to those in FIG. 1 are employed also in FIG. 4.

In the aforementioned step 2, the reaction speculated as occurring in the reaction solution is represented by the reaction formula 1 presented below.

$$[Cd(NH_3)_4]^{2+} + (NH_2)_2CSe \rightarrow CdSe + 4NH_3 + (NH_2)_2C^{2+}$$ 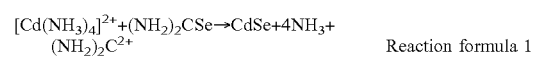

Reaction formula 1

As shown in FIG. 4, the condition for the aforementioned reaction solution is a condition in which a large number of ammonium ions ($NH_4^+$) are present. Thus, most cadmium ions ($Cd^{2+}$) are stabilized through turning to be $[Cd(NH_3)_4]^{2+}$ which is a complex ion. Therefore, it follows that the relationship between the concentration of $[Cd(NH_3)_4]^{2+}$ and the concentration of $Cd^{2+}$ becomes "concentration of $[Cd(NH_3)_4]^{2+}$ >> concentration of $Cd^{2+}$".

Since the surface of the holding part 4 of apoferritin 1 is negatively charged, $[Cd(NH_3)_4]^{2+}$ introduced into the holding part 4 passing through the channel 3 as illustrated by the arrow A. As a consequence, $[Cd(NH_3)_4]^{2+}$ is concentrated to a high concentration in the holding part 4.

Because seleno urea does not have any charge, it is present in an even manner both outside and inside of the holding part 4 of apoferritin 1. Seleno urea immediately initiates decomposition slowly but immediately upon dissolving in water at room temperature. Decomposition of its entirety takes several hours to generate $Se^{2-}$.

Since there exists $Cd^{2+}$ supplied from $[Cd(NH_3)_4]^{2+}$ which was concentrated to a high concentration, $Se^{2-}$ generated in the holding part 4 of apoferritin 1 immediately reacts to give the deposit of CdSe, which is then crystallized.

Because $Cd^{2+}$ and $Se^{2-}$ are insoluble in water when CdSe is formed, they are never ionized reversibly. Hence, in the holding part 4 of apoferritin 1, concentrations of $[Cd(NH_3)_4]^{2+}$ and seleno urea in the solution are decreased. Therefore, a concentration gradient is caused between the outside and the inside of the holding part 4 of apoferritin 1, leading to the introduction of $[Cd(NH_3)_4]^{2+}$ and seleno urea that are present outside into the holding part 4 of apoferritin 1 by passing through the channel 3, as shown by the arrows A and B. In the holding part 4 of apoferritin 1, the reaction of generation of CdSe is repeated until the supply of $Cd^{2+}$ and $Se^{2-}$ from $[Cd(NH_3)_4]^{2+}$ and seleno urea is terminated.

On the other hand, outside of the apoferritin 1, the amount of $Cd^{2+}$ is extremely small after the onset of the reaction, therefore, the reaction velocity of the generated $Se^{2-}$ with $Cd^{2+}$ is extremely slow. Therefore, CdSe is scarcely generated outside of apoferritin 1. In other words, each ion can be subjected to the reaction preferentially in the cavity part of apoferritin 1.

Although seleno urea is dissolved in water immediately before the reaction, seleno urea is labile in water. As a result, concurrently with the preparation of the reaction solution, the selenium atom of seleno urea is ionized, and thus $Se^{2-}$ is supplied into the reaction solution. Accordingly, in this embodiment, seleno urea is excessively added to give $Se^{2-}$ in an amount of 5 times of $Cd^{2+}$ such that $Se^{2-}$ is not deficient in the holding part 4 of apoferritin 1.

In FIGS. 5A, 5B and 5C, images are illustrated obtained by the observation of the reaction solution immediately after the step St2 with an electron microscope, through allowing the formation of nanoparticles of CdSe with changing the amount of added ammonia in the step St1, according to this embodiment. FIGS. 5A, 5B and 5C are electron micrographs showing the state of formation of the nanoparticles obtained when the aqueous ammonia added to the reaction solution is adjusted to provide the concentration of ammonia ($NH_3$) in the reaction solution of 0 mM, 0.5 mM and 1.0 mM, respectively. A minute amount of ammonia is dissociated from ammonium acetate, which is believed to hardly affect the concentration of ammonium indicated herein. Semiconductor nanoparticles of CdSe are representatively denoted by outline arrows in FIGS. 5A, 5B and 5C.

As shown in FIGS. 5A, 5B and 5C, the formation of semiconductor nanoparticles of CdSe is dependent on the concentration of ammonia, with the most favorable formation of nanoparticles achieved when the concentration of ammonia is 0.5 mM.

The reaction solution shown in FIG. 5A has the pH of 6.6; the reaction solution shown in FIG. 5B has the pH of 7.4; and the reaction solution shown in FIG. 5C has the pH of 7.9. Therefore, it is believed that ammonia also serves in making CdSe more apt to be deposited through keeping the pH of the reaction solution free from a buffering agent, concurrently with stabilizing $Cd^{2+}$ through coordination therewith. Thus, it is preferred that the pH of the reaction solution is kept in the range of from 7.0 or greater to 9.5 or less. In addition, even though the amount of ammonia is elevated to 20000 by the mixing ratio listed in Table 1, similar effects are achieved.

Because the reaction system as described above is assumed, it is speculated that the mixing ratio of each of chemical substances desirably represents the number of molecules in the range listed in Table 1 when the number of molecules of apoferritin is postulated to be 1.

TABLE 1

| Molecule | Mixing ratio (ratio of number of molecules) |
| --- | --- |
| Apoferritin | 1 |
| Cadmium acetate | 100–10000 |
| Ammonium acetate | 5000–500000 |
| Seleno urea | 500–50000 |
| Ammonia | 10–20000 |

According to a method of the production as described hereinabove, a semiconductor nanoparticle can be formed which is preferentially composed of CdSe within apoferritin.

Proteins including apoferritin are produced on the basis of information of a DNA, and are readily reproduced in a large number by any known method. Further, it is well known that proteins reproduced from the identical DNA in a large number have the same structure in an accuracy of the angstrom level. Therefore, all of the holding parts having a cavity-like shape carried by apoferritin used in this embodiment exhibit the same shape.

Accordingly, when semiconductor nanoparticles are produced by a chemical reaction within a protein according to this embodiment, the particle size of the semiconductor nanoparticles is defined by the protein, resulting in semiconductor nanoparticles having a uniform particle size. In accordance with this embodiment in which the reaction solution was prepared as shown in FIG. 3, the resulting CdSe nanoparticles had a spherical shape with the diameter thereof being 6 nm (standard deviation: 1 nm). In other words, it can be fund that nanoparticles having a uniform particle size could be obtained.

Additionally, although apoferritin was used as a protein according to this embodiment, when Dps protein (a spherical shell-like protein having the diameter of 9 nm, and having a holding part inside thereof with the diameter of 4 nm) is used instead of apoferritin, semiconductor nanoparticles having the particle size of 4 nm can be produced. Furthermore, use of a viral protein such as CCMV, TMV or the like instead of apoferritin also achieves the production of semiconductor nanoparticles in compliance with the shape of the holding part carried by each of the protein.

Moreover, instances in which semiconductor nanoparticles which are composed of CdSe are produced were explained according to this embodiment, however, almost similar method to the method of this embodiment can be also applied to the instances in which semiconductor nanoparticles which are composed of other group II–group VI compound semiconductor, e.g., ZnSe, CdS, ZnS or the like.

For example, when semiconductor nanoparticles composed of ZnSe are produced, a zinc acetate solution is mixed in the reaction solution instead of the cadmium acetate solution used in this embodiment. Other conditions are as set forth in this embodiment.

Further, when semiconductor nanoparticles composed of CdS are produced, a thiourea ($H_2NCSNH_2$) solution is mixed in a reaction solution instead of the seleno urea solution used in this embodiment. Other conditions are as set forth in this embodiment.

When semiconductor nanoparticles composed of ZnS are produced, a zinc acetate solution instead of the cadmium acetate solution and a thiourea solution instead of the seleno urea solution are mixed in a reaction solution. Other conditions are as set forth in this embodiment.

For a reference, the group II–group VI compound semiconductor is a wide band gapped semiconductor of direct transition. Therefore such a property can be also utilized in addition to the property as a nanoparticle, leading to benefit in a large variety of applications.

In the following embodiments, examples of the utilization of nanoparticles and nanoparticle-protein complexes produced according to this embodiment are explained.

(Embodiment 2)

Figure 6A:
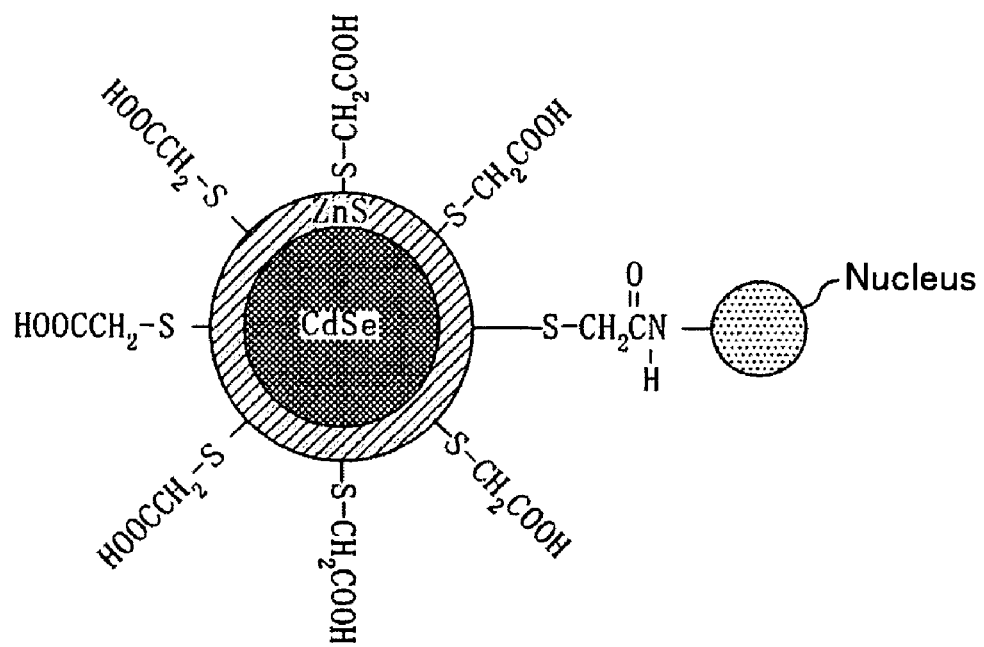
FIGS. 6A and 6B are schematic views illustrating states in which semiconductor nanoparticles having different particle sizes are respectively bound to actin filaments and cores of cells.
Figure 6B:
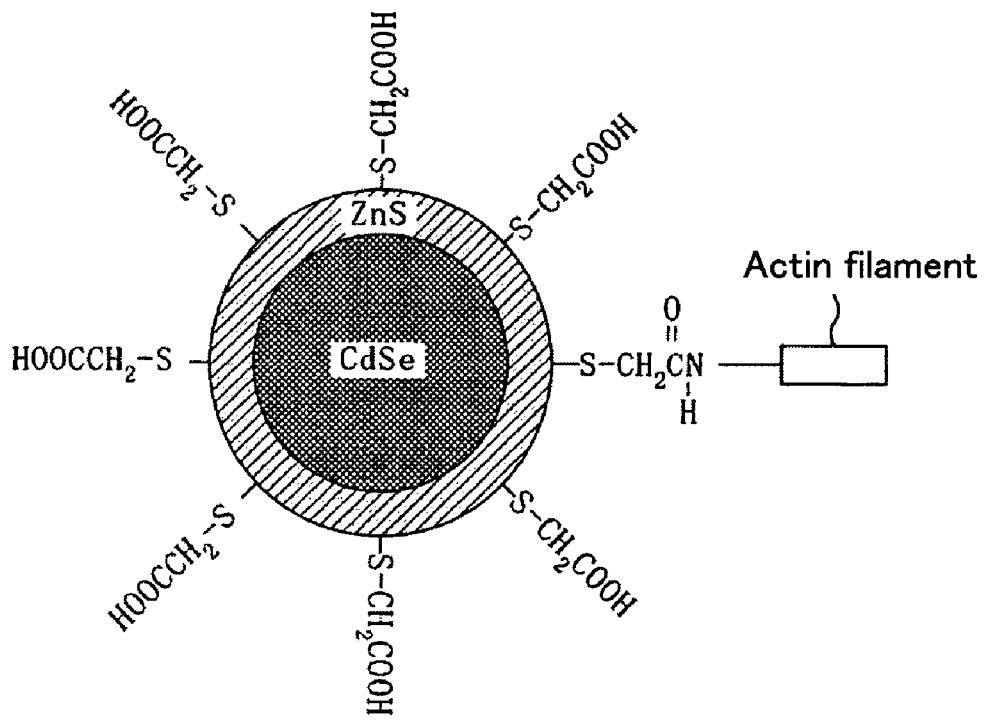

It is suggested that semiconductor nanoparticles composed of CdSe, ZnSe, CdS, ZnS and the like are quantized in terms of the inside electron level, and the fluorescent wavelength is altered depending on their particle size. Thus, as shown in FIGS. 6A and 6B, methods are reported in which semiconductor nanoparticles having different particle sizes are bound to cellular actin filament and nucleus respectively, and different fluorescent colors are allowed to be expressed through the excitation with a single wavelength, thereby readily observing migration and position of the two proteins in the cell (R. F. Sevice, Science, Vol. 281, 1998, pp. 1930–1931, M. Bruchez Jr. et al., Science, Vol. 281, 1998, pp. 2013–2016, and W. C. W. Chan et al., Science, Vol. 281, 1998, pp. 2016–2018).

A fluorescent staining agent such as rhodamine has been heretofore used for the fluorescence observation of cells and the like. However, fluorescence itself of the fluorescent staining agents such as rhodamine is weak, and thus the fluorescent fading which is referred to as quenching occurs within a few seconds, leading to failure in emission. In addition, fluorescence by a fluorescent staining agent such as rhodamine extends toward red (long wavelength side), which is a phenomenon referred to as red tailing. Accordingly the fluorescence approaches to any fluorescent region of other fluorescent staining agent, resulting in generation of cross talk. Further, since the difference between the wavelength of an excitation light irradiated for the purpose of observing fluorescence, and the wavelength of fluorescence from the fluorescent staining agent approximates several ten nm, a steep wavelength filter is required. Hence, apparatuses for the excitation light and wavelength filters are required in numbers of the fluorescent staining agents, thereby making the constitution of an apparatus for the fluorescence observation (e.g., fluorescence microscope) complicated. When the constitution of the apparatus for the fluorescence observation becomes complicated, securement of the amount of light becomes difficult, resulting in needs of a blight lens. Therefore, designing of the apparatus for the fluorescence observation becomes difficult, and the cost of the apparatus for the fluorescence observation is markedly elevated as well.

However, upon fluorescence observation in which nanoparticles composed of CdSe having different particle sizes are used as in the report described above, a light with a single wavelength which is in a far shorter wavelength side from the fluorescent wavelength (e.g., ultraviolet ray) may be used as an excitation light. Because the color of fluorescence is determined by the particle size of the nanoparticle composed of CdSe, no red tailing occurs, and no filter becomes necessitated. Thus, simplification of constitution of the apparatus for the fluorescence observation is accomplished. Therefore, securement of the amount of light becomes easy, thereby enabling a brilliant fluorescence observation even though a simple and inexpensive fluorescence microscope is used.

In summary, to obtain semiconductor nanoparticles of CdSe having each uniform particle size for every size of several varieties of particle sizes enables fluorescence observation through labeling of intracellular proteins in an extremely inexpensive manner.

However, according to conventional physical grinding methods or chemical synthesis methods, the particle size of the produced semiconductor nanoparticles of CdSe and ZnSe is not uniform, leading to mixed presence of particles having various fluorescent wavelengths. Therefore, the semiconductor nanoparticles produced by any of conventional physical grinding methods or chemical synthesis methods can not be used for fluorescent labeling as they are. Hence, in the reports as described above, an accurate purification step is required for the separation on the basis of the particle size in a nanometer order in order for the semiconductor nanoparticles of CdSe and ZnSe to be used as a fluorescent labeling material. Accordingly, mass-productivity of the semiconductor nanoparticle is very low, whilst the cost for the fluorescence observation is also very high.

In addition, when semiconductor nanoparticles are produced by a conventional method, surfaces of the semiconductor nanoparticle are not coated, therefore, to regulate the dispersion and aggregation is difficult. In order to obviate such a difficulty, coating of the surface of the semiconductor nanoparticle with an organic material is proposed in the aforementioned report. However, because a step for coating the surface of the semiconductor nanoparticle is further added, mass-productivity of the semiconductor nanoparticles becomes further low, and the production cost for the fluorescence observation also becomes extremely high.

On the other hand, the semiconductor nanoparticles obtained in the embodiment 1 described above have a uniform particle size. Therefore, when several kinds of proteins having holding parts with different diameter for holding a semiconductor nanoparticle are used, semiconductor nanoparticles of CdSe having each uniform particle size for every size of several kinds of particle sizes can be readily obtained. Thus, an accurate purification step becomes unnecessary for the separation of the semiconductor nanoparticles on the basis of the particle size. Consequently, fluorescent observation has come to be achieved through labeling intracellular proteins in an extremely inexpensive manner.

Furthermore, according to the semiconductor nanoparticle-protein complex obtained in the aforementioned embodiment 1, amino acid residues are exposed on the surface of the protein. The amino acid residues exposed on the surface can be altered by a genetic engineering procedure such as recombination. It is permitted thereby to allow for a positive or negative charge, or to impart hydrophobicity or hydrophilicity at an arbitrary position on the surface of the semiconductor nanoparticle-protein complex. Therefore, regulation of dispersion and aggregation of semiconductor nanoparticles can be accomplished without coating the surface of the semiconductor nanoparticles with an organic material.

Figure 7A:
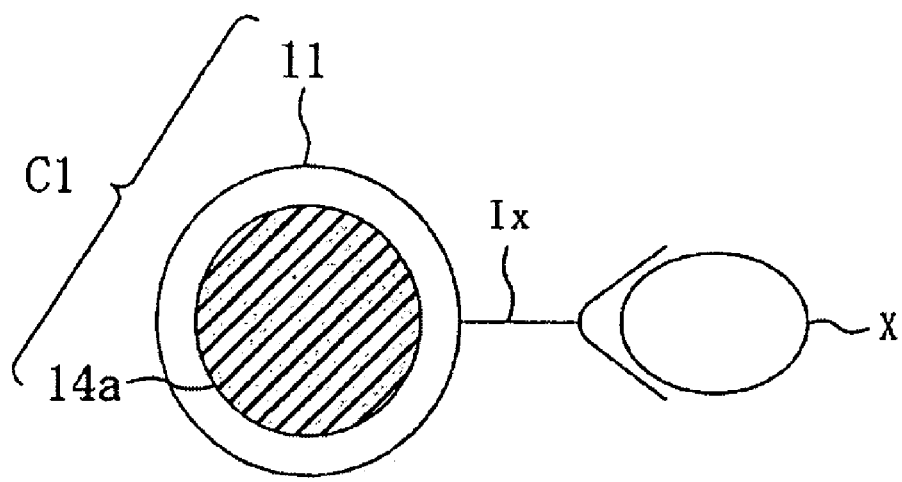
FIGS. 7A and 7B are schematic views illustrating a method for labeling a protein with a semiconductor nanoparticle-protein complex through the utilization of an antibody.
Figure 7B:
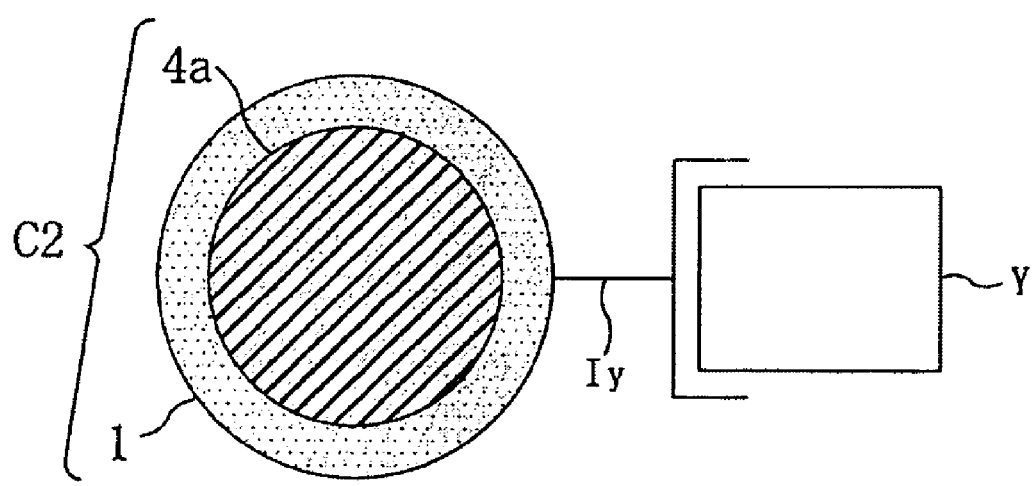

Moreover, the semiconductor nanoparticle-protein complex can be interacted with other protein through the chemical modification of a part of amino acids of the protein. Specifically, explanation is conducted with reference to FIGS. 7A and 7B. FIGS. 7A and 7B are schematic views illustrating a method for labeling a protein with a semiconductor nanoparticle-protein complex through the utilization of an antibody.

The semiconductor nanoparticle-protein complex C1 is, as shown in FIG. 7A, a complex comprising Dps protein 11 and a semiconductor nanoparticle 14a of CdSe. To the surface of the Dps protein 11 is bound an end on the side, which does not bind to a protein X, of the antibody Ix which specifically recognizes the protein X (C-terminal end of an H chain).

The semiconductor nanoparticle-protein complex C2 is, as shown in FIG. 7B, a complex comprising apoferritin 1 and a semiconductor nanoparticle 4a of CdSe. To the surface of apoferritin 1 is bound an end on the side, which does not bind to a protein Y, of the antibody Iy which specifically recognizes the protein Y (C-terminal end of an H chain).

In brief, the semiconductor nanoparticle-protein complexes C1 and C2 have semiconductor nanoparticles of CdSe included therein having each uniform particle size for every size of two different particle sizes. In addition, the semiconductor nanoparticle-protein complex C1 specifically binds to the protein X, while the semiconductor nanoparticle-protein complex C2 specifically binds to the protein Y. Therefore, migration and position of the two proteins in the cell can be readily observed through irradiating an excitation light having a single wavelength (e.g., ultraviolet ray), thereby allowing the expression of different fluorescent colors with respect to each protein X or protein Y.

As set forth above, since the semiconductor nanoparticle-protein complex obtained in the embodiment 1 has a constitution including a semiconductor nanoparticle covered with a protein, utilization for the observation of a living body can be easily conducted using fluorescence through alteration of the protein.

In this embodiment, examples in which semiconductor nanoparticles of CdSe are used as a fluorescent material were explained, however, similar effects can be achieved as a matter of course, even though any other fluorescent material (ZnSe, CdS, ZnS and the like) is used.

(Embodiment 3)

In this embodiment, a nonvolatile memory cell is explained which includes dot bodies formed by utilizing nanoparticle-protein complexes produced in the embodiment 1 described above, as a floating gate.

FIG. 8(a) to FIG. 8(d) are process sectional views illustrating a method of the production of a nonvolatile memory cell of this embodiment.

Figure 8:
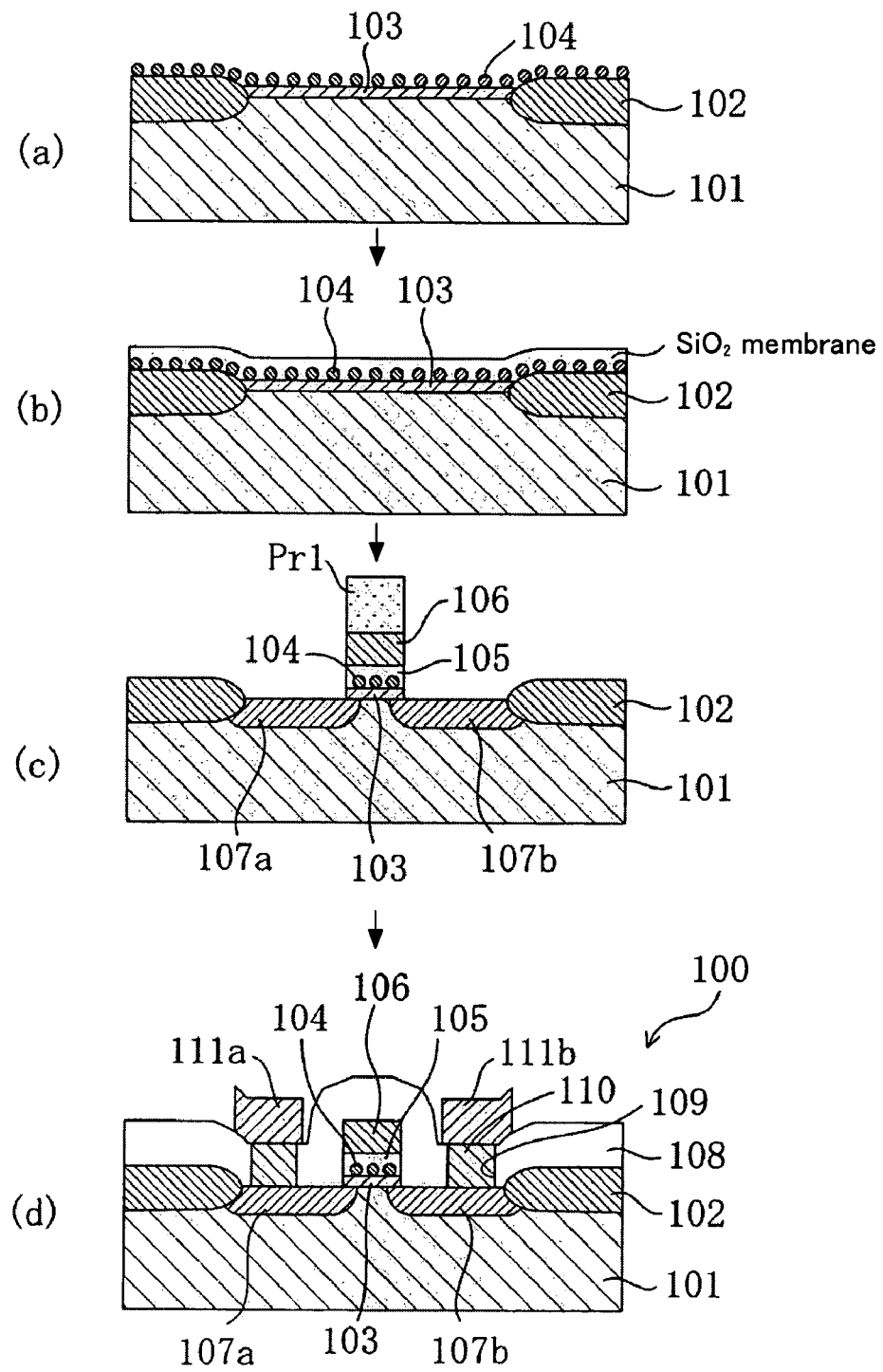
FIGS. 8(*a*)–(*d*) are process sectional views illustrating a method of the production of a nonvolatile memory cell.

First, in the step depicted in FIG. 8(a), on a type p Si basal plate 101 is formed a chip separating oxide membrane 102 surrounding the active region by a LOCOS method, and thereafter a gate oxide membrane 103 which functions as a tunnel insulation membrane is formed on the basal plate by a thermal oxidation method. Then, dot bodies 104 composed of a nanoparticle having the particle size of approximately 6 nm are formed on the basal plate. Process for forming the dot bodies 104 on the basal plate is explained later.

Next, in the step depicted in FIG. 8(b), on the basal plate is deposited a SiO$_2$ membrane into which the dot bodies 104 are embedded by a sputter method or a CVD method.

Next, in the step depicted in FIG. 8(c), an Al membrane is deposited on the basal plate. Subsequently, a silicon oxide membrane 105 which shall be an insulation membrane between electrodes and an Al electrode 106 which shall be a regulation gate electrode are formed by patterning of the SiO$_2$ membrane and Al membrane using a photo resist mask Pr1. Upon this manipulation, a part without being covered by the photo resist mask Pr1 of the gate oxide membrane 103 is eliminated, therefore, the dot bodies 104 thereon are concurrently eliminated. Thereafter, first and second diffusion layers 107a and 107b of type n are formed through carrying out the infusion of an impure ion, with the photo resist mask and the Al electrode 106 as masks.

Then, in the step depicted in FIG. 8(d), formation of an insulation membrane 108 between layers; opening of a contact hole 109 of the insulation membrane 108 between layers; formation of a tungsten plug 110 by embedding tungsten into a contact hole 109; and formation of first and second aluminum wiring 111a and 111b are carried out by any known method.

Although an Si basal plate of type p was used in this embodiment as a basal plate, also an Si basal plate of type n may be used, or alternatively, any basal plate which is constituted from other semiconductor such as a compound semiconductor including GaAs may be also used.

Figure 9:
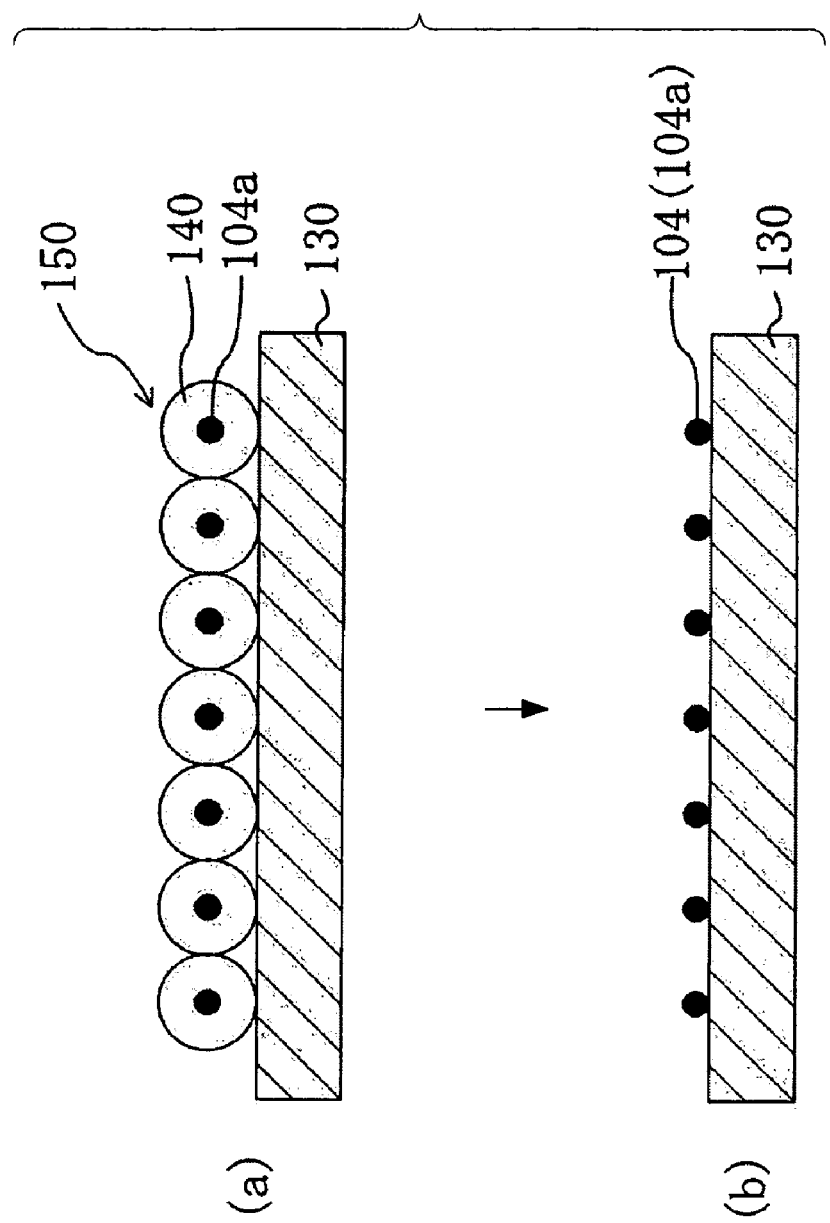
FIG. 9 is a process sectional view illustrating a method of arranging and fixing dot bodies on the surface of a basal plate in a two dimensional fashion.
Figure 10:
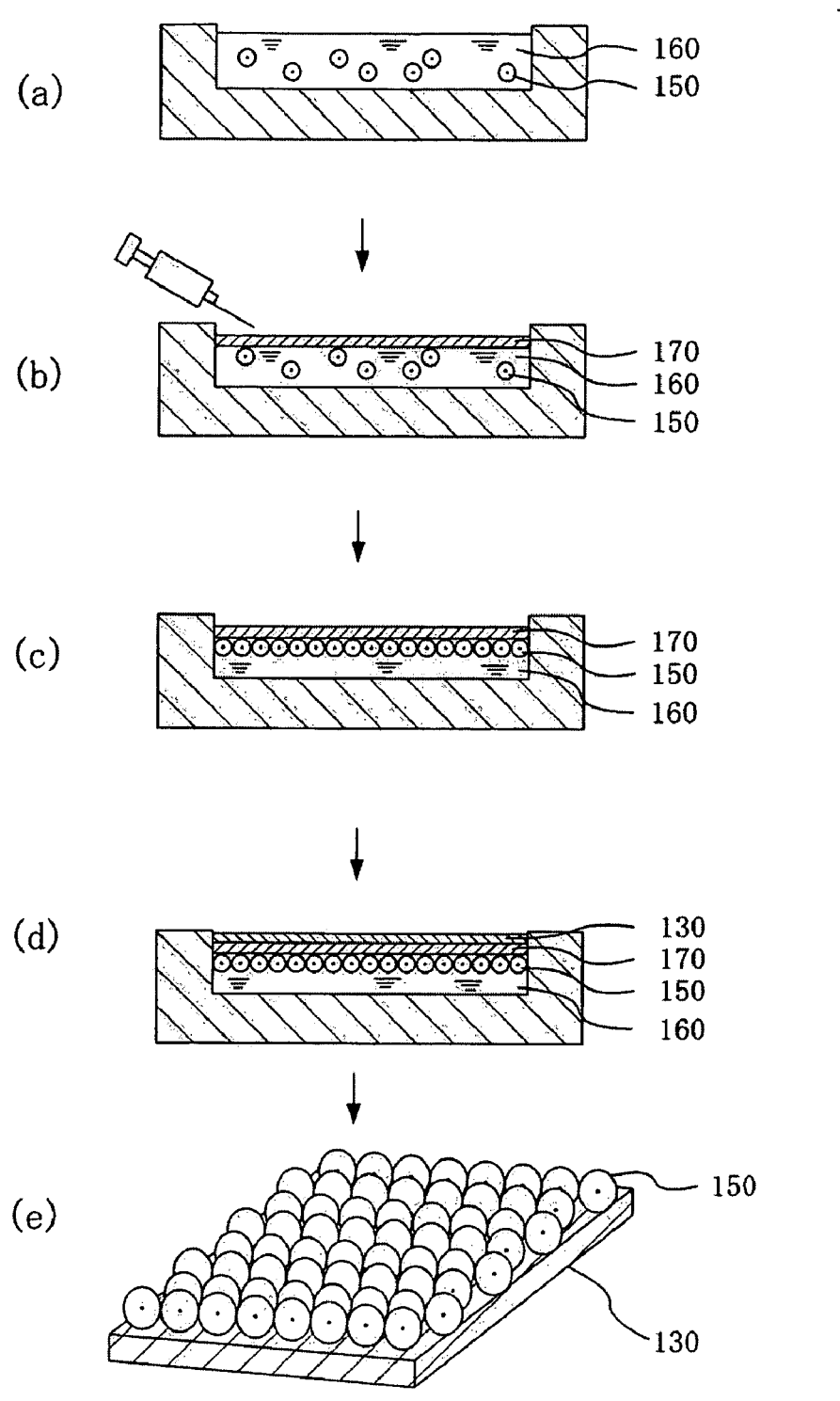
FIG. 10 is a view for explaining a method of arranging and fixing complexes on the surface of a basal plate in a two dimensional fashion.

Next, a process for forming dot bodies 104 on the basal plate in the step depicted in FIG. 8(a) is explained below with reference to FIG. 9 and FIG. 10. However, the process for forming dot bodies 104 on the basal plate is not limited to the process as explained below, but any other known process can be also applied.

First, in the step depicted in FIG. 9(a), nanoparticle-protein complexes (hereinafter, abbreviated as "complex") 150 obtained in the aforementioned embodiment 1 are provided, and these complexes 150 are arranged on the surface of a basal plate 130. Accordingly, a complex membrane having the complexes 150 arranged on the surface of the basal plate 130 at high density and with high accuracy is formed. The basal plate 130 herein refers to that formed on an Si basal plate 101 of type p in the step depicted in FIG. 8(a) by a LOCOS method through forming a chip separating oxide membrane 102 surrounding the active region, and thereafter forming a gate oxide membrane 103 which functions as a tunnel insulation membrane on the basal plate by a thermal oxidation method. Similar matter can be applied in the following explanation.

Next, in the step depicted in FIG. 9(b), dot bodies 104 are formed on the basal plate 130 by eliminating the proteins 140 in the complexes 150 to leave the nanoparticles 104a alone.

In the step depicted in FIG. 9(a), the process for arranging the complexes 150 on the basal plate 130 at high density and with high accuracy, in other words, for aligning and fixing in a two dimensional fashion on the basal plate 130 is now explained. In this embodiment, explanation is made below for the process described in JP-A No. 11-45990 with reference to FIG. 10.

First, as shown in FIG. 10(a), a liquid 160 including complexes 150 dispersed therein is provided. In this embodiment, a liquid including nanoparticle-protein complexes dispersed in a mixed liquid of a 20 mM NaCl solution and a 20 mM MES buffer solution (pH 5.8) is used as the liquid 160. MES herein means 2-morpholinoethanesulfonic acid.

Subsequently, as shown in FIG. 10(b), PBLH (Poly-1-Benzil-L-Histidine) is gently developed on the surface of the liquid 160 with a syringe or the like. Polypeptide membrane 170 which is composed of PBLH is thereby formed on the surface of the liquid 160. Thereafter, the pH of the liquid 160 is adjusted.

Next, as shown in FIG. 10(c), the complexes 150 are adhered on the polypeptide membrane 170 in a time dependent manner to yield two dimensional crystals of the complexes 150. This is caused by the positively charged polypeptide membrane 170, contrary to the negatively charged complexes 150.

Next, as shown in FIG. 10(d), the basal plate 130 is placed (floated) on the polypeptide membrane 170 to allow adhesion of the polypeptide membrane 170 onto the basal plate 130.

Next, by recovering the basal plate 130 as shown in FIG. 10(e), the basal plate 130 having two dimensional crystals of the complexes 150 via the polypeptide membrane 170 can be obtained.

Next, the step depicted in FIG. 9(b) is explained in more detail.

Since a protein is generally weak against heat, elimination of the protein 140 in the complex 150 is carried out by a heat treatment. For example, by standing still in an inert gas such as nitrogen or the like at 400–500° C. for about 1 hour, the protein 140 and the polypeptide membrane 170 are burnt out, and thus nanoparticles 104a remain on the basal plate 130 in a two dimensional fashion as dot bodies 140 at high density and with high accuracy, which are regularly aligned.

As set forth above, the dot bodies 140 which are aligned at high density and with high accuracy can be formed by rendering the nanoparticles 104a that were held by the complexes 150 appear on the basal plate 130 in a two dimensional fashion, as shown in FIG. 9(b).

As shown in FIG. 8(d), the memory cell 100 of this embodiment is equipped with the Al electrode 106 which functions as a regulation gate and a MOS transistor (memory cell transistor) composed of the first and second diffusion layers 107a and 107b of type n which function as a source or a drain, and is a nonvolatile memory cell in which alteration of threshold potential of the aforementioned memory transistor is utilized on the basis of the amount of the charge accumulated in the dot bodies 104 which function as a floating gate.

A function as a memory which memorizes two values can be achieved according to this nonvolatile memory cell, however, memory of multiple values that are three values or more can be also accomplished by controlling not only the presence of the charge accumulated in the dot bodies 104 but also the amount of accumulation of the charge.

Upon clearing data, an FN (Fowler-Nordheim) current via an oxide membrane or a direct tunneling current is utilized.

Further, for writing data, an FN current via the oxide membrane, a direct tunneling current or a channel hot electron (CHE) infusion is used.

Since the nonvolatile memory cell of this embodiment is composed of nanoparticles having the particle size small enough to allow the floating gate to function as a quantum dot, the amount of the accumulation of charge becomes slight. Therefore, the amount of current upon writing and clearing can be diminished, and thus a nonvolatile memory cell with low electric power consumption can be constituted.

Additionally, according to the nonvolatile memory cell of this embodiment, because the particle size of nanoparticles that constitute the floating gate is uniform, properties exhibited during infusion and drawing of the charge are uniform among each nanoparticle, and thus regulation upon these manipulations can be readily conducted.

In the production of the aforementioned memory cell, a sputter method is often used when $SiO_2$ membrane 105 is deposited such that dot bodies 104 are embedded in the step depicted in FIG. 8(b)

Nanoparticles of iron, cobalt or the like which have been obtained using apoferritin heretofore exist as an oxide inside of apoferritin. Hence, for preparing dot bodies having a charge retention characteristic from the nanoparticles in the step depicted in FIG. 8(b) when dot bodies are formed utilizing nanoparticles of iron, cobalt or the like, the nanoparticles are required to be reduced.

However, nanoparticles used in the invention, which are obtained in the aforementioned embodiment 1 and are composed of CdSe, ZnSe, CdS, ZnS, FePt, CoPt or the like have an charge retaining characteristic with no need to be reduced. Thus, necessity to conduct the reducing step of the nanoparticles is avoided. Therefore, lowering of the cost upon the formation of dot bodies is enabled.

(Other Embodiment)

As demonstrated in the embodiment 3 described above, it is also possible to integrate nanoparticles on a basal plate in a nanometer scale, according to the present invention. Therefore, it is believed that the production of an arithmetic element is also possible in which give-and-take of a light energy among the semiconductor nanoparticles which generate fluorescence is utilized.

According to the present invention, semiconductor nanoparticles having a uniform particle size can be obtained. When an excitation light is irradiated on semiconductor nanoparticles having a uniform particle size, fluorescence having a particular wavelength is emitted.

In addition, also in instances in which nanoparticles composed of FePt or CoPt are produced, nearly similar method to that in the embodiment 1 can be applied.

When nanoparticles composed of FePt are produced, an ammonium ferric sulfate solution instead of the cadmium acetate solution, and a $K_2PtCl_4$ solution instead of the seleno urea solution used in the embodiment 1 are admixed in the reaction solution. Other conditions are as described in the embodiment 1.

When nanoparticles composed of CoPt are produced, specifically, a cobalt acetate solution instead of the cadmium acetate solution, and a $K_2PtCl_4$ solution instead of the seleno urea solution used in the embodiment 1 are admixed in the reaction solution. Other conditions are as described in the embodiment 1.

It will be obvious to those having skill in the art that many changes may be made in the above-described details of the preferred embodiments of the present invention. The scope of the present invention, therefore, should be determined by the following claims.

What is claimed is:

1. A method of production of a nanoparticle including a protein having a cavity inside and one of CdSe, CdS, ZnSe and ZnS filled in the cavity, the method comprising the step of:

filling the cavity with one of CdSe, CdS, ZnSe and ZnS by mixing the protein including the cavity inside, a complex ion $[M(NH_3)_4]^{2+}$ (M being one of Cd and Zn), and $H_2NCXNH_2$ (X being one of S and Se) with water, wherein the protein includes a channel connecting between the cavity and the outside of the protein and an inner spherical surface of the protein has a negative electric charge.

2. The method of production of a nanoparticle according to claim 1, wherein said X is Se.

3. The method of production of a nanoparticle according to claim 1, wherein said X is S.

4. The method of production of a nanoparticle according to claim 1, wherein said protein is at least one of apoferritin, Dps protein, CCMV protein or TMV protein.

5. The method of production of a nanoparticle according to claim 1, wherein said method further comprises a step of eliminating the protein by a heat treatment after filling the cavity with one of CdSe, CdS, ZnSe and ZnS.

6. The method of production of a nanoparticle according to claim 1, wherein said M is Cd.

7. The method of production of a nanoparticle according to claim 1, wherein said M is Zn.

* * * * *